(12) United States Patent
Nishijima et al.

(10) Patent No.: US 10,192,806 B2
(45) Date of Patent: Jan. 29, 2019

(54) SEMICONDUCTOR DEVICE

(71) Applicant: FUJI ELECTRIC CO., LTD., Kawasaki-shi (JP)

(72) Inventors: Takahiro Nishijima, Matsumoto (JP); Takashi Katsuki, Matsumoto (JP); Toshio Denta, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/180,627

(22) Filed: Jun. 13, 2016

(65) Prior Publication Data

US 2016/0300778 A1     Oct. 13, 2016

Related U.S. Application Data

(63) Continuation of application No. PCT/JP2015/061902, filed on Apr. 17, 2015.

(30) Foreign Application Priority Data

May 30, 2014   (JP) .................................. 2014-112516

(51) Int. Cl.
| | |
|---|---|
| *G01P 3/14* | (2006.01) |
| *H01L 21/50* | (2006.01) |
| *H01L 23/48* | (2006.01) |
| *H01L 23/29* | (2006.01) |
| *H01L 23/373* | (2006.01) |

(Continued)

(52) U.S. Cl.
CPC ........ *H01L 23/3735* (2013.01); *H01L 23/057* (2013.01); *H01L 23/24* (2013.01);
(Continued)

(58) Field of Classification Search
CPC ......... H01L 23/3735; H01L 2023/4068; H01L 2023/4037; H01L 23/36; H01L 23/495
(Continued)

(56) References Cited

U.S. PATENT DOCUMENTS

| | | |
|---|---|---|
| 6,373,124 B1 | 4/2002 | Kato et al. |
| 2002/0149094 A1 | 10/2002 | Sakabe |

(Continued)

FOREIGN PATENT DOCUMENTS

| | | |
|---|---|---|
| CN | 104170075 A | 11/2014 |
| JP | 2004-186662 A | 7/2004 |

(Continued)

OTHER PUBLICATIONS

PCT, "International Search Report for International Application No. PCT/JP2015/061902".

(Continued)

*Primary Examiner* — Tuan Nguyen
(74) *Attorney, Agent, or Firm* — Manabu Kanesaka (57) ABSTRACT

A semiconductor device includes an insulating substrate having a metal plate, an insulating resin plate, and a circuit plate laminated in order; a semiconductor element fixed to the circuit plate; a wiring member connected to an electrode disposed on a front surface of the semiconductor element or to the circuit plate of the insulating substrate; a housing accommodating the insulating substrate, the semiconductor element, and the wiring member; and a sealing material including a thermosetting resin, and sealing the insulating substrate, the semiconductor element, and the wiring member accommodated in the housing. The circuit plate of the insulating substrate is selectively formed on the insulating resin plate as a combination of a circuit pattern with a sealing material adhering pattern.

12 Claims, 6 Drawing Sheets

(51) Int. Cl.
*H01L 23/057* (2006.01)
*H01L 23/24* (2006.01)
*H01L 23/31* (2006.01)
*H01L 23/12* (2006.01)

(52) U.S. Cl.
CPC .......... *H01L 23/3142* (2013.01); *H01L 23/12* (2013.01); *H01L 2224/32225* (2013.01); *H01L 2224/48091* (2013.01); *H01L 2224/48227* (2013.01); *H01L 2224/49175* (2013.01); *H01L 2224/73265* (2013.01); *H01L 2924/181* (2013.01); *H01L 2924/19107* (2013.01)

(58) Field of Classification Search
USPC .......................................................... 257/707
See application file for complete search history.

(56) References Cited

U.S. PATENT DOCUMENTS

| | | | |
|---|---|---|---|
| 2003/0160317 A1* | 8/2003 | Sakamoto | H01L 21/4821 257/690 |
| 2004/0119158 A1* | 6/2004 | Tatt | H01L 23/3677 257/707 |
| 2009/0267214 A1* | 10/2009 | Kumazawa | H01L 23/49524 257/690 |
| 2014/0347836 A1* | 11/2014 | Nakamura | H01L 23/3121 361/764 |

FOREIGN PATENT DOCUMENTS

| | | | | |
|---|---|---|---|---|
| JP | 2010-010568 A | | 6/2008 | |
| JP | 2013-016684 | * | 1/2013 | ............. H01L 23/28 |
| JP | 2013-016684 A | | 1/2013 | |
| WO | 2013/136895 A1 | | 9/2013 | |
| WO | WO 2013/136895 | * | 11/2014 | |
| WO | WO 2013-136895 | * | 11/2014 | |

OTHER PUBLICATIONS

Japan Patent Office, "Office Action for Japanese Patent Application No. 2016-523379," dated Jun. 13, 2017.
China Patent Office, "Office Action for Chinese Patent Application No. 201580003023.0," dated Jan. 23, 2018.

* cited by examiner

SEMICONDUCTOR DEVICE

CROSS-REFERENCE TO RELATED APPLICATION

This is a continuation application of PCT International Application of PCT/JP2015/061902 filed on Apr. 17, 2015, which claims a priority of Japanese Patent Application No. 2014-112516 filed on May 30, 2014, disclosure of which is incorporated herein.

TECHNICAL FIELD

The present invention relates to a semiconductor device.

BACKGROUND OF THE INVENTION

A power semiconductor module, in which one or more semiconductor elements (semiconductor chips) are equipped in a case sealed with a sealing material, is known as a semiconductor device. The power semiconductor module is, for example, interpreted so that the power semiconductor element is mounted on an insulating substrate. The insulating substrate is constituted of a metal plate, an insulating resin plate formed on one surface of the metal plate, and a circuit plate in which a predetermined circuit is formed so that a conductive metal foil such as copper foil is formed selectively on the insulating resin plate. The metal plate is, for example, composed of the copper foil having excellent conductivity. Further the insulating resin plate is composed of an insulating resin.

The power semiconductor element is fixed to the circuit plate of the insulating substrate with solder, so that an electrode disposed on one face of the power semiconductor element is connected to the circuit plate electrically. Furthermore, connection can be achieved electrically by using bonding wires or the like among another electrode disposed on the other face of the power semiconductor element, the circuit plate, terminals connecting to the outside, and the like.

The power semiconductor chip is accommodated in a housing. Moreover, the sealing material composed of a thermosetting resin is injected to cover the power semiconductor chip and the bonding wires in the housing. This can protect the semiconductor chip, the bonding wires, the circuit plate, and the like in the housing, insulating one from the others.

The sealing material composed of the thermosetting resin has lower adhesive properties to the circuit plate of the insulating substrate than to the insulating resin plate. Further, the sealing material is different from the circuit plate in thermal expansion coefficient. Therefore, the sealing material is liable to peel off from the interface between the sealing material and the circuit plate of the insulating substrate because heat is generated repeatedly when the power semiconductor chip is operated. If the peeling of the sealing material is enlarged to reach a junction of the bonding wire, this might affect the state where the bonding wire is joined.

In order to improve adhesive properties between the sealing material and the circuit plate of the insulating substrate, there is provided a semiconductor device in which a lot of micro recessed parts are formed to the part except the region where a semiconductor chip is mounted on the front surface of the circuit plate in which the semiconductor chip is adhered (Patent Literature 1).

CITATION LIST

Patent Literature

Patent Literature 1: Japanese Unexamined Patent Application Publication No. 2004-186662

DISCLOSURE OF INVENTION

Problem to be Solved by the Invention

However, when plenty of micro recessed parts are formed on the front surface of a circuit plate, it takes a large amount of time. This leads manufacturing cost to increase, resulting in production efficiency deterioration.

Therefore, in order to solve the problem described above advantageously, it is an object of the present invention to provide a semiconductor device which enables to improve adhesive properties between a circuit plate of an insulating substrate and a sealing resin including a thermosetting resin.

Means for Solving Problems

According to an aspect of the present invention, there is provided a semiconductor device comprising: an insulating substrate which is constituted so as to laminate a metal plate, an insulating resin plate, and a circuit plate in order; a semiconductor element which is fixed to the circuit plate of the insulating substrate; a wiring member which is connected to an electrode disposed on the front surface of the semiconductor element or to the circuit plate of the insulating substrate; a housing which accommodates the insulating substrate, the semiconductor element, and the wiring member; and a sealing material which includes a thermosetting resin, wherein the sealing material seals the insulating substrate, the semiconductor element, and the wiring member which are accommodated in the housing; wherein the circuit plate of the insulating substrate is selectively formed on the insulating resin plate as a combination of a circuit pattern with a sealing material adhering pattern.

Effect of the Invention

According to the embodiment described above, the circuit plate of the insulating substrate is formed selectively as the combination of the circuit pattern with the sealing material adhering pattern. As the sealing material contacts the insulating resin plate of the insulating substrate in the part where the sealing material adhering pattern is disposed, this allows adhesive properties to improve in comparison with a conventional semiconductor device which contacts the circuit plate. Consequently, this can prevent peeling from developing to the junction of the bonding wire.

MODES FOR CARRYING OUT THE INVENTION

Embodiments according to a semiconductor device of the present invention will be described concretely while referring to figures hereinafter.

Figure 1A:
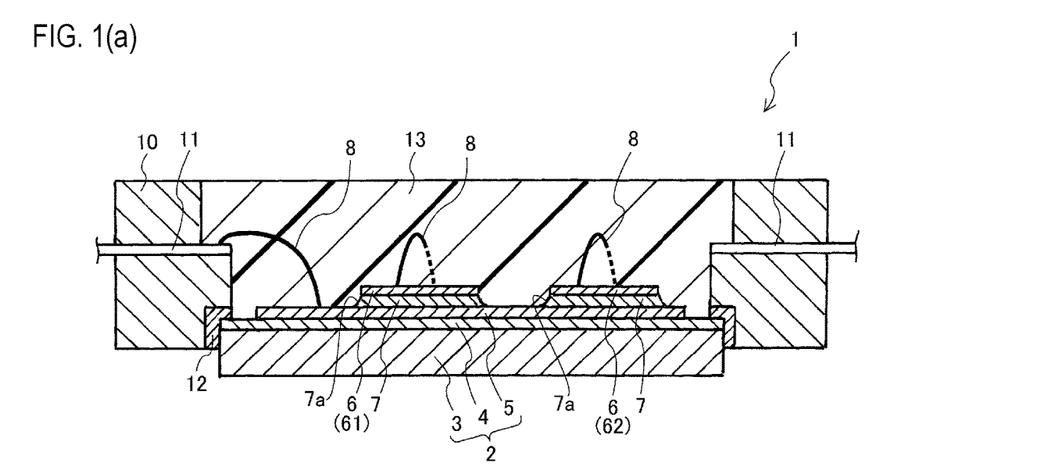
FIGS. 1(a) and 1(b) show schematic cross section views of a semiconductor device according to one embodiment of the present invention.
Figure 1B:
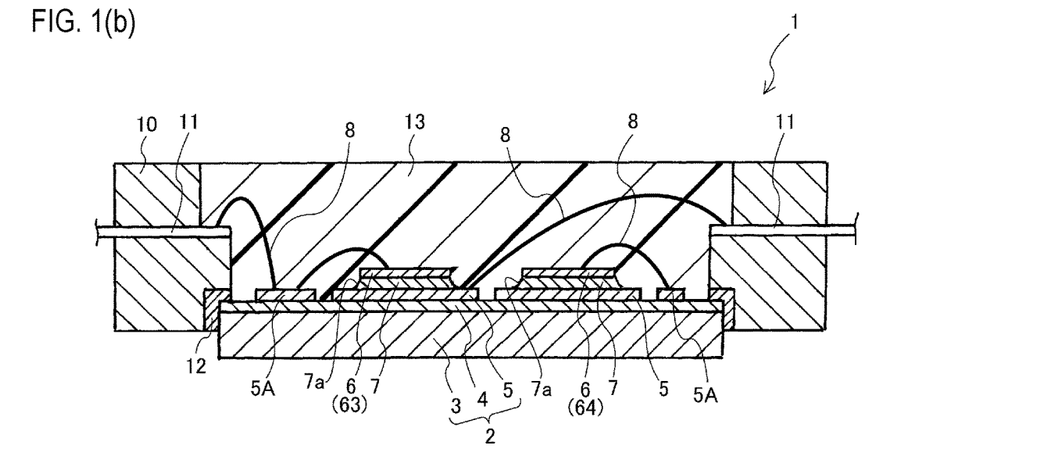
Figure 2:
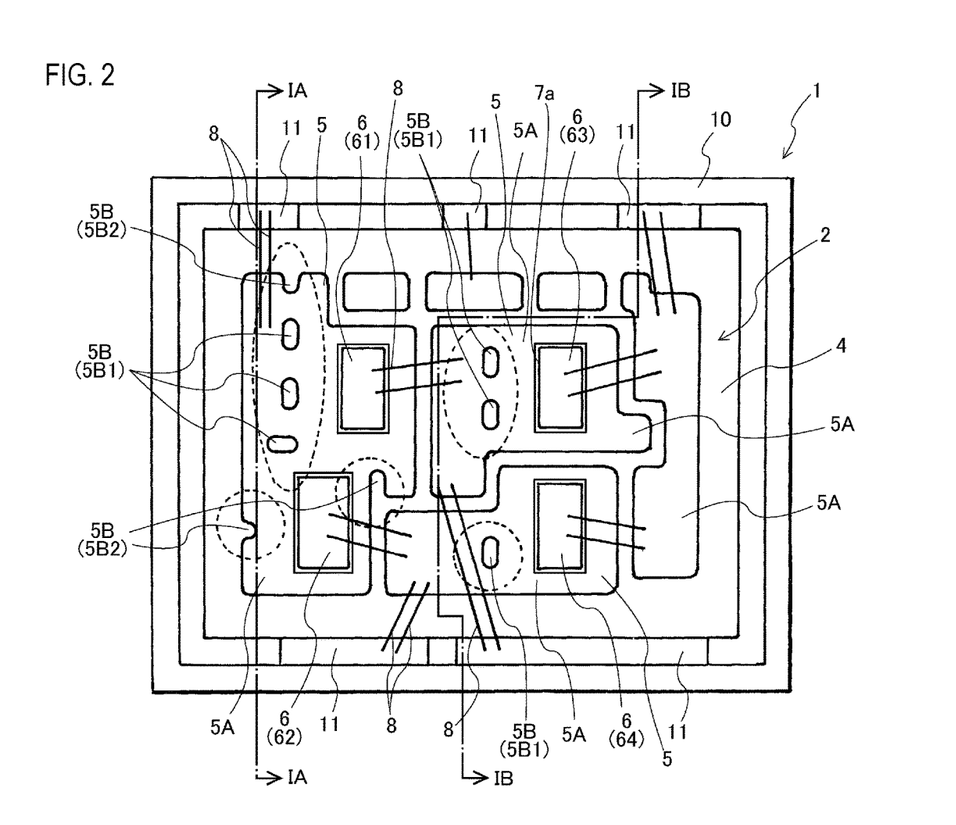
FIG. 2 shows a plan view of the semiconductor device according to the one embodiment of the present invention.
Figure 3:
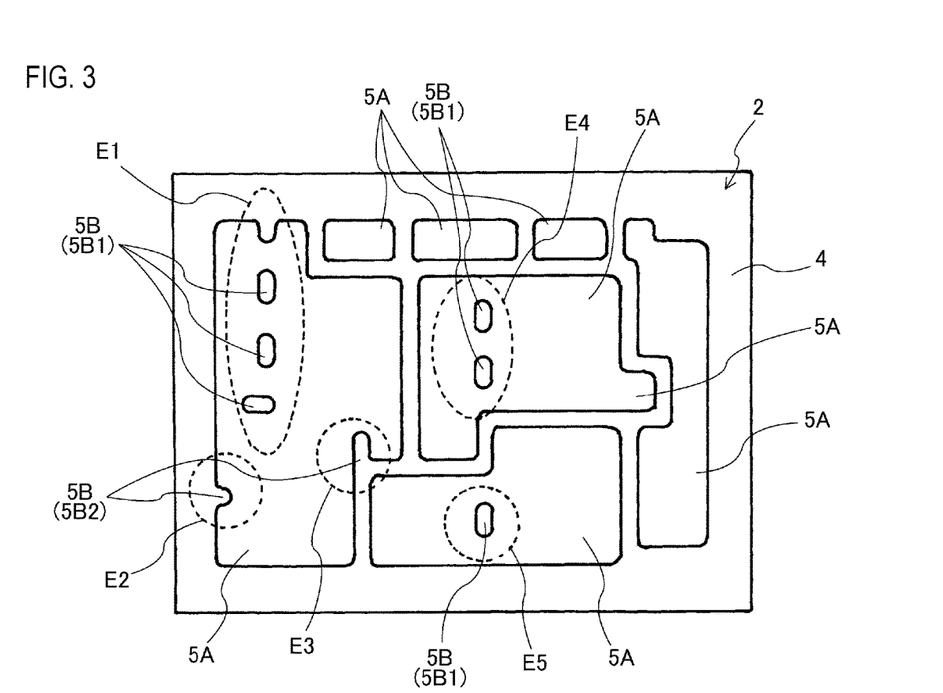
FIG. 3 shows a plan view of an insulating substrate of the semiconductor device shown in FIG. 2.

FIGS. 1(a) and 1(b) show schematic cross section views of a semiconductor device according to one embodiment of the present invention. Then, FIG. 2 shows a plan view of the semiconductor device according to the one embodiment of the present invention. And FIG. 3 shows a plan view of an insulating substrate of the semiconductor device shown in FIG. 2. FIG. 1(a) illustrates an outline of the cross section cut along the line 1A-1A shown in FIG. 2, and then FIG. 1b illustrates an outline of the cross section cut along the line 1B-1B shown in FIG. 2.

A semiconductor device 1 according to the present embodiment comprises an insulating substrate 2, on which a semiconductor chip 6 is fixed with solder 7 which is a jointing material. The insulating substrate 2 is constituted of a metal plate 3, an insulating resin plate 4 laminated on one surface of the metal plate 3, and a circuit plate 5 laminated on the insulating resin plate 4.

The metal plate 3 of the insulating substrate 2 is composed of a metal material having excellent thermal conductivity such as aluminum or copper. The insulating resin plate 4 is composed of an insulating resin. Any material is available for the insulating resin plate 4 if it is a resin having insulation properties. However, it is preferable that the resin has excellent thermal conductivity in order to radiate heat from the semiconductor chip 6. A liquid crystal polymer having excellent thermal conductivity and an epoxy resin as a sealing material 13 described later can be concretely employed for the insulating resin plate 4 of the insulating substrate 2. The insulating resin plate 4 can be formed so that those resins described above may be coated on the metal plate 3.

The circuit plate 5 of the insulating substrate 2, which is composed of the metal material having excellent electric conductivity such as copper, is formed selectively on one surface of the insulating resin plate 4 so that a predetermined circuit can be formed by conductive metal foil such as copper foil. The semiconductor chip 6 is joined to one surface of the circuit plate 5 through solder 7. A fillet 7a of the solder 7 is formed around the periphery of the semiconductor chip 6 to the side where the circuit plate 5 is located. Further, one end of a bonding wire 8 which is a wiring member is joined to the one surface of the circuit plate 5. Furthermore, different electronic components such as a capacitor chip and the like may be joined to the one surface of the circuit plate 5.

The semiconductor chip 6 may be, for example, any one of a diode chip, a power MOSFET chip, and an insulating gate bipolar transistor (IGBT) chip. In particular, the kind of the semiconductor chip is not selected. When a plurality of semiconductor chips 6 is disposed on the circuit plate 5 of the insulating substrate 2, the chips may be either the same kind of chips or a combination of semiconductor chips different from each other. When the semiconductor chip 6 is a vertical semiconductor element, there are two electrodes which are provided on the respective two principal surfaces which are opposed to each other. One electrode disposed on one principal surface is connected to the circuit plate 5 electrically through the solder 7. One end of the bonding wire 8 is joined to the other electrode disposed on the other principal surface. In addition, the semiconductor element 6 may be a lateral semiconductor element, not limited to the vertical semiconductor element.

The bonding wire 8 shown in FIGS. 1(a), 1(b) and 2 is composed of a conductive thin line of aluminum, aluminum alloy, and the like. However, the wiring member is not limited to the bonding wire 8, and then it may be a bus bar, for example. Further, it may be a combination of a conductive post and a wiring circuit board (for example, a printed circuit board).

Each of the insulating substrate 2, the semiconductor chip 6, and the bonding wire 8 is accommodated in a case 10. The case 10 comprises integrally a lead 11 which is connected to the outside electrically. In the semiconductor device 1 according to the present embodiment, there is provided the lead 11 which extends outwardly from the internal surface side of the case 10 so that it protrudes from the exterior surface thereof. In the internal surface side of the case 10, the lead 11 is joined to the other end of the bonding wire 8 to the one end, in which each of the semiconductor chip 6 and the circuit plate 5 of the insulating substrate 2 is joined or connected.

The case 10 is formed of another insulating resin and the like. The lower end of the case 10 is joined to the periphery of the metal plate 3 and the insulating resin plate 4 of the insulating substrate 2 with an insulating adhesive 12. This leads insulation properties between the insulating substrate 2 and the case 10 to be ensured, and then a gap is eliminated between the insulating substrate 2 and the case 10. Then, this prevents the sealing material 13 from leaking to the outside through the gap.

The sealing material 13 is filled into a hollow space through the upper end of the case 10, so that each of the circuit plate 5 of the insulating substrate 2, the semiconductor chip 6, and the bonding wire 8 is sealed therewith. The sealing material 13, which is composed of a thermosetting resin such as an epoxy-resin, is preferable because it has excellent heat resisting properties and high insulation properties.

Each of FIGS. 1(a) and 1(b) shows the outline of cross section view of the semiconductor device 1 according to the present embodiment. FIG. 2 shows the plan view of the semiconductor device 1 shown in FIGS. 1(a) and 1(b) according to the present embodiment.

In FIG. 1(a), semiconductor chips 61 and 62 are mounted on one circuit plate 5. The circuit plate 5 is connected to the lead 11 (left side in the figure) with the bonding wire 8. Another bonding wire 8 joined to the other principal surface of the semiconductor chip 61 is joined to another circuit plate 5 in which a semiconductor chip 63 is mounted. Further, another bonding wire 8 joined to the other principal surface of the semiconductor chip 62 is joined to still another circuit plate 5 in which a semiconductor chip 64 is mounted.

In FIG. 1(b), the semiconductor chips 63 and 64 are mounted on the respective circuit plates 5 which are disposed to be adjacent to each other and insulated electrically. Still another bonding wire 8 joined to the other principal surface of the semiconductor chip 63 is joined to a circuit pattern 5A shown at the right side in FIG. 2. Still another bonding wire 8 joined to the other principal surface of the semiconductor chip 64 is joined to the circuit pattern 5A which is the same as the above description and used in common. The circuit pattern 5A, which is used in common, is connected to the lead 11 (left side in the figure) with still another bonding wire 8. Furthermore, the circuit plate 5 in which the semiconductor chip 63 is mounted is connected to the lead 11 (right side in the figure) with still another bonding wire 8. In order to interpret the configuration described above, the circuit pattern 5A, which is used in common, shown in the right side of FIG. 2 is depicted so as to be deformed slightly in FIG. 1(b).

The case 10 of the semiconductor device 1 shown in the figure is composed of the insulating resin such as a PPS resin and the like, and has almost a cuboid shape, which has a hollow space so as to form a frame shape. The case 10 houses the insulating substrate 2, four pieces of semiconductor chips 6 (61, 62, 63, and 64), and the bonding wires 8 in the hollow space. The circuit plates 5 of the insulating substrate 2 and the bonding wires 8 shown in FIG. 2 provide a configuration so that the semiconductor chips 61, 62, 63, and 64 can work as switching elements. In addition, illustration of the sealing material 13 is omitted in FIG. 2 to facilitate understanding of the present invention.

In an instance shown in FIG. 2, the one circuit plate 5 in which the semiconductor chip 61 is mounted is disposed in adjacent manner with another circuit plate 5, having almost L shape, in which the semiconductor chip 63 is mounted on the insulating resin plate 4. Electrodes (not shown) are disposed on the two respective principal surfaces, which are opposed to each other, in the semiconductor chip 61 and the semiconductor chip 63. In the almost L shape circuit plate 5, a plurality of openings 5B1 is formed along with the fillet 7a located under the semiconductor chip 63 as a sealing material adhering pattern 5B between an area where the semiconductor chip 63 is mounted and another area where the bonding wire 8 is joined. Two groups of bonding wires 8 are joined to the almost L-shape circuit plate 5. One group of bonding wires 8 is joined to the other principal surface of the semiconductor chip 61, connecting the electrode located on one principal surface of the semiconductor chip 63 in series with the other principal surface of the semiconductor chip 61 electrically. The other group of the bonding wires 8 is joined to the lead 11, connecting the electrode located on the one principal surface of the semiconductor chip 63 with the lead 11 electrically. As the sealing material adhering pattern 5B is formed between the fillet 7a located under the semiconductor chip 63 and the two group of bonding wires 8 in which each group is connected to different destination, the sealing material 13 peeling which occurs on the fillet 7a can be stopped from progressing to the sides where the bonding wires 8 are connected.

In the insulating substrate 2, each of the circuit plates 5 in which each of the semiconductor chips 61, 62, 63, or 64 is fixed is selectively formed on the insulating resin plate 4 so that the predetermined circuit pattern 5A is combined with the sealing material adhering pattern 5B. The circuit pattern (circuit section) is a conductive metal foil in which a circuit wiring diagram is formed, and then the sealing material adhering pattern (bonded section) 5B is a conductive metal foil in which a figure which can increase adhesiveness with sealing material is formed as an opening or a recess. The sealing material adhering pattern 5B, as shown in FIG. 2, is an opening 5B1 which is disposed in the circuit pattern 5A and a recess 5B2 which is disposed around the periphery of the circuit pattern 5A and formed so as to face the inside of the circuit pattern 5A.

No circuit plate is formed in the section where the sealing material adhering patterns 5B such as the opening 5B1 and the recess 5B2 are disposed. Thus, the sealing material 13 in the case 10 contacts the insulating resin plate 4 of the insulating substrate 2 in this section (the inside of the opening 5B1 and the recess 5B2), adhering (bonding) thereto. In comparison with the circuit plate 5, the insulating resin plate 4 has higher adhesive properties with the sealing material 13, so that adhesive properties with the sealing material 13 can be enhanced in each of sections where the sealing material adhering patterns 5B are disposed.

FIG. 3 shows the plan view of the insulating substrate 2. The sealing material adhering patterns 5B such as the openings 5B1 and the recesses 5B2 are provided in each of areas E1, E2, E3, E4, and E5 which are surrounded by broken lines within the area where the circuit plate 5 is formed. These areas E1, E2, E3, E4, and E5 are located in the vicinity where the semiconductor chip is fixed with solder 7.

The sealing material 13 peeling, which occurs from the circuit plate 5, is generated from the fillet 7a of the solder 7, for example, as a starting point around the periphery of the area where the semiconductor chip is fixed, developing gradually. In order to prevent the sealing material 13 from peeling and then to avoid the peeling from reaching to a junction of the one end of the bonding wire 8, the areas E1, E2, E3, E4, and E5 in which the sealing material adhering patterns 5B are disposed are preferably provided between the area where the semiconductor chip 6 is fixed and the junction of the bonding wire 8. In order to prevent the sealing material 13 peeling from developing, the areas E1, E2, E3, E4, and E5 are more preferably provided between the area where the semiconductor chip 6 is fixed and the junction where the bonding wire 8 is joined to the circuit plate 5 so that each thereof is located close to the semiconductor chip 6. Further, it is preferable that the openings 5B1 and the recesses 5B2 are formed along the end part of the semiconductor chip 6 or the fillet 7a. A plurality of openings 5B1 may be arranged to have a configuration in plural rows or in zigzag manner other than in a row.

However, when the sealing material adhering patterns 5B such as the openings 5B1 and the recesses 5B2 approach to the semiconductor chip 6 excessively, a fillet of the solder 7 which fixes the semiconductor chip 6 to the circuit plate 5 is liable to flow into the openings 5B1 and the recesses 5B2 during assembly. As a result, this might decrease an effect improving adhesive properties. When a size of the fillet of the solder 7, for example, is approximately eight times thickness of the solder 7, concretely about 100 μm in thickness, it might flow out from the end part of the semiconductor chip 6 by about 0.8 mm. Then, the openings 5B1 and the recesses 5B2 are preferably disposed so as to be separated from the end part of the semiconductor chip 6 at least by 1.0 mm or by about ten times thickness of the solder 7.

When an electronic component except the semiconductor chip 6 such as a capacitor chip is disposed so as to be fixed with the solder 7 on the circuit plate 5 of the insulating substrate 2, the sealing material adhering patterns 5B such as the openings 5B1 and the recesses 5B2 described above can be disposed also in the vicinity of the electronic component. The openings 5B1 and the recesses 5B2 are preferably disposed so as to be separated from the end part of the electronic component at least by 1.0 mm or by about ten times thickness of the solder 7 also in this case.

One or more than one opening 5B1 at almost equal intervals is disposed in the areas E1, E4, and E5. If a plurality of openings 5B1 is disposed without a space between the semiconductor chip 6 and the junction of the bonding wire 8, or if a linear opening, which is made up so that the openings 5B1 are coupled, is disposed therebetween, this allows adhesive properties of the sealing material 13 to improve. On the other hand, a current path in which a current flows from the semiconductor chip 6 to the bonding wire 8 through the circuit plate 5 or another current in the opposite direction will circumvent the opening. As a result, this might increase resistance or inductance. Then, when the openings 5B1 are disposed side by side between the semiconductor chip 6 and the junction of the bonding wire 8, it is preferable that more than one opening is disposed at intervals. However, if the interval between the openings 5B1 is excessively long, this may reduce an effect to stop the peeling which develops from a part of the semiconductor chip. Therefore, it is preferable that the interval between the openings 5B1 is approximately 2 mm or less, for example.

There is no limitation in size and shape for the opening 5B1 particularly. In the present embodiment shown in FIGS. 2 and 3, the opening 5B1 has an elliptical shape or a shape in which semicircles are connected so as to replace the respective short sides of a rectangle, which is approximately 2 mm in longitudinal length and approximately 1 mm in lateral length. Then, an interval between the openings is about 2 mm in length. The lateral length of the opening 5B1 is about ten times thickness of the solder 7.

The recess 5B2 is disposed in the areas E1, E2, and E3. The recess 5B2 enables adhesive properties to improve around the periphery of the circuit pattern 5A. The recess 5B2 can be set independently or side by side with the opening 5B1. The recess 5B2 is preferably set in the vicinity of the semiconductor chip 6 or the different electronic component as well as the opening 5B1.

In the semiconductor device 1 according to the present embodiment, the circuit plate 5 of the insulating substrate 2 is formed selectively not only of the circuit pattern 5A but also of a combination of the circuit pattern 5A and the sealing material adhering pattern 5B. Then, the presence of the opening 5B1 and the recess 5B2 of the sealing material adhering pattern 5B allows adhesive properties with the sealing material 13 to increase in the part where the sealing material adhering pattern 5B is provided.

Figure 4:
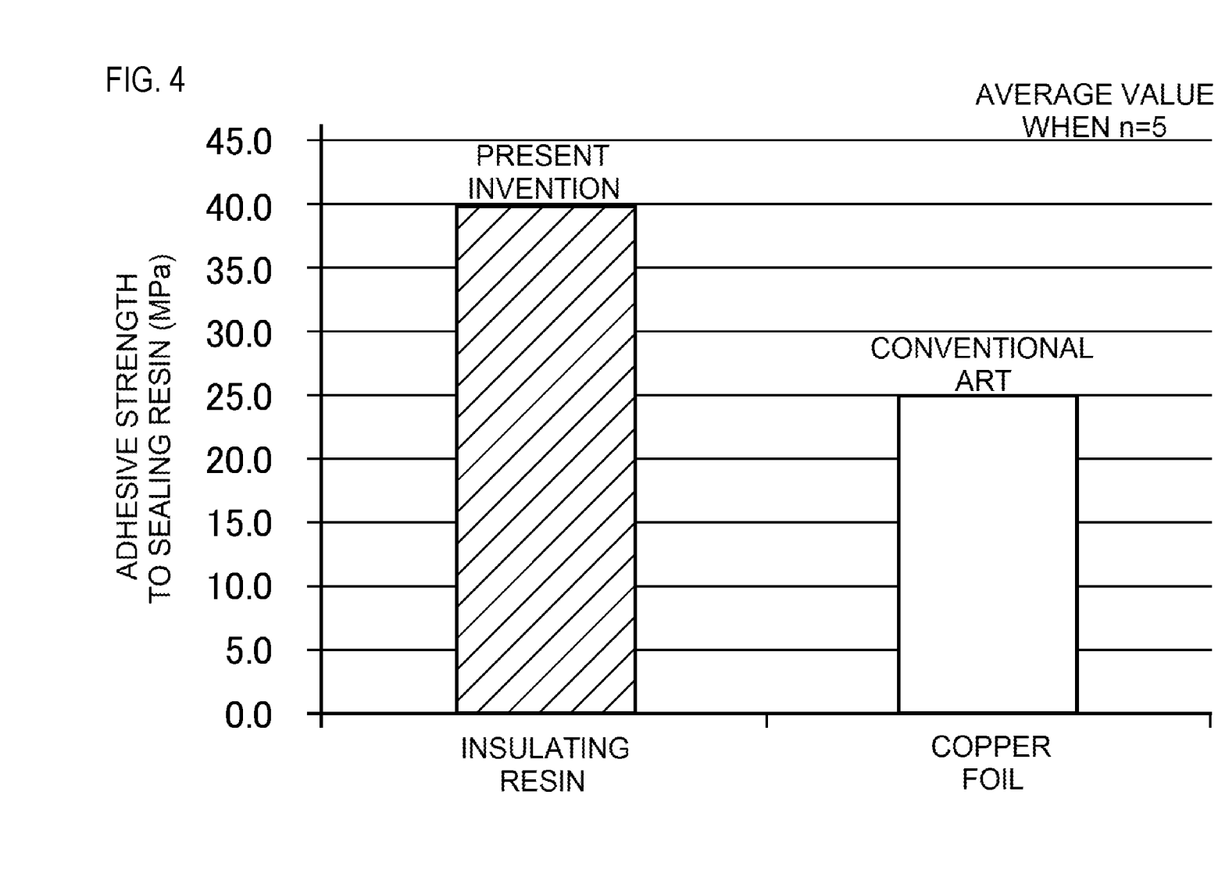
FIG. 4 shows a graph in which adhesive strength is studied between a thermosetting resin employed as a sealing material and an insulating resin used in an insulating resin plate and also between the thermosetting resin and copper foil used in a circuit plate.

FIG. 4 indicates a graph illustrating a result studied about adhesive strength between the thermosetting resin employed for the sealing material and the insulating resin employed for the insulating resin plate 4 of the insulating substrate 2 and between the thermosetting resin and copper foil employed for the circuit plate 5. FIG. 4 shows that the insulating resin has higher adhesive strength to the sealing material than the copper foil. Therefore, according to the present invention, adhesive properties are improved because the opening 5B1 and the recess 5B allow the sealing material 13 to adhere to the insulating resin plate 4 when the circuit plate 5 is formed so that the circuit pattern 5A is combined with the sealing material adhering pattern 5B.

Figure 5:
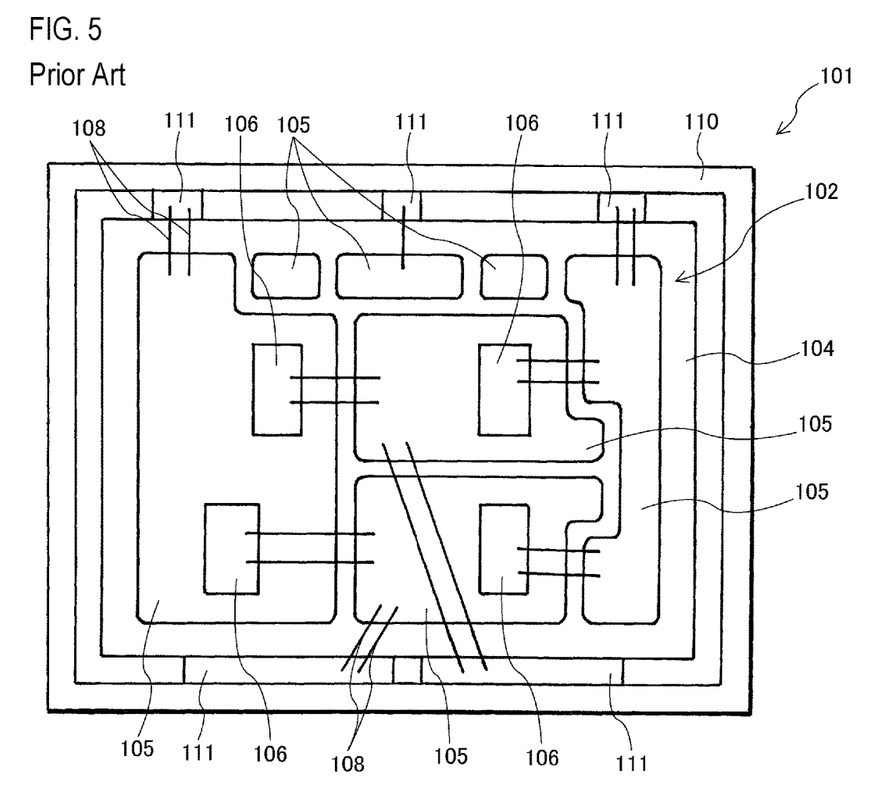
FIG. 5 shows a plan view according to one conventional semiconductor device.
Figure 6:
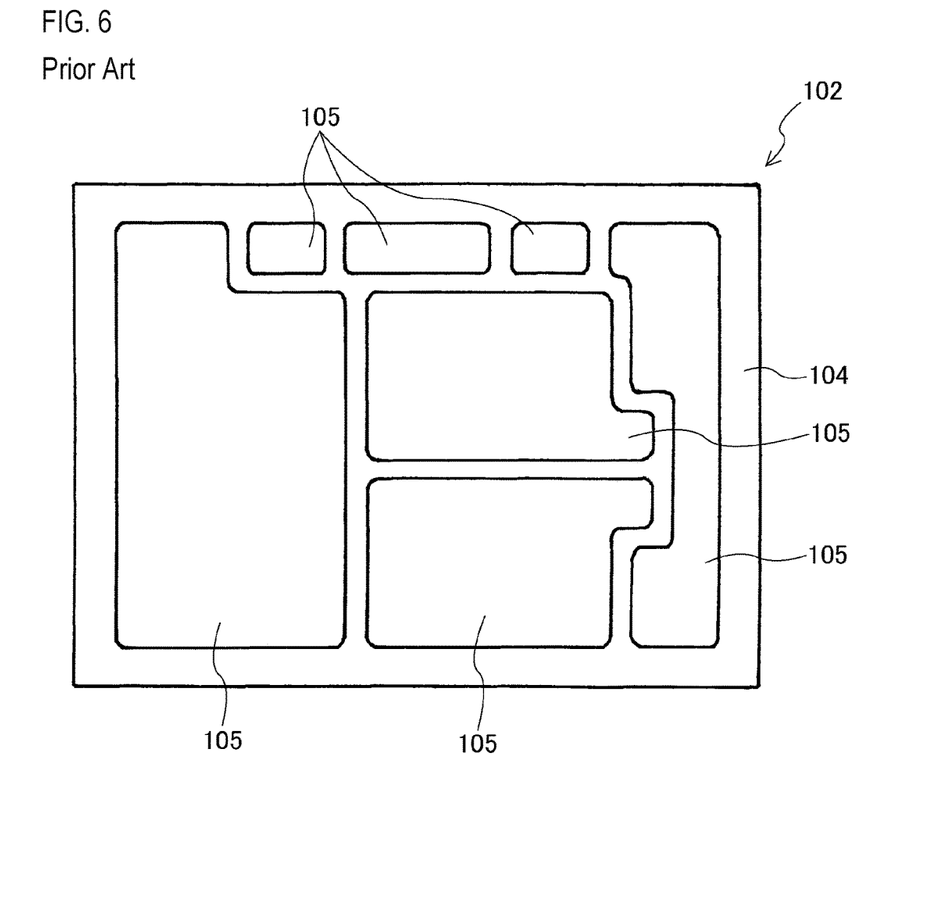
FIG. 6 shows a plan view of an insulating substrate of the semiconductor device shown in FIG. 5.

For comparison, FIGS. 5 and 6 show plan views with regard to a conventional semiconductor device 101 and an insulating substrate 102 thereof, respectively.

The semiconductor device 101 comprises the insulating substrate 102. The insulating substrate 102 is formed of a metal plate (not shown), an insulating resin plate 104 laminated on one surface of the metal plate, and a circuit plate 105 laminated on the insulating resin plate 104. A semiconductor chip 106 is joined to one surface of circuit 105 through a solder. One end of a bonding wire 108 is joined to an electrode disposed on one principal surface of the semiconductor chip 106.

A case 110 accommodates the insulating substrate 102, the semiconductor chip 106, and the bonding wire 108. The case 110 includes integrally a lead 111 which is connected to the outside electrically. In the internal surface side of the case 110, the lead 111 is joined to the other end of the bonding wire 108 to one end in which the semiconductor chip 106 and the circuit plate 105 of the insulating substrate 102 are joined.

The lower part of the case 110 is joined to the periphery of the metal plate 103 and the insulating resin plate 104 of the insulating substrate 102 with the insulating adhesive not shown. Illustrations of the sealing material filled in the case 110 are omitted in FIGS. 5 and 6.

The conventional semiconductor device 101 shown in FIGS. 5 and 6 is different from the semiconductor device 1 according to the embodiment of the present invention in that the circuit plate 105 of the insulating substrate 102 is selectively formed using a predetermined circuit pattern on the insulating resin plate 104. Namely, the circuit plate 105 shown in FIG. 6 is formed using only the circuit pattern, and not formed using the sealing material adhering pattern 5B shown in FIG. 3. Then the opening 5B1 and the recess 5B2 shown in FIG. 3 are not disposed therein. In comparison with the conventional semiconductor device 101 including the insulating substrate 102 having such the circuit plate 105, the semiconductor device 1 according to the present embodiment has excellent adhesive properties of the sealing material 13.

The semiconductor device according to the present invention is described concretely using figures and embodiments as above. The semiconductor device according to the present invention is not limited to the description of the embodiments and the figures and then changeable variously within the scope being not deviated from the gist thereof.

EXPLANATIONS OF LETTERS OR NUMERALS

1: semiconductor device
2: insulating substrate
3: metal plate
4: insulating resin plate
5: circuit plate
5A: circuit pattern
5B: sealing material adhering pattern
6: semiconductor chip (semiconductor element)
7: solder
8: bonding wire (wiring member)
10: case (housing)
13: sealing material

What is claimed is:
1. A semiconductor device comprising:
an insulating substrate including a metal plate, an insulating resin plate laminated on the metal plate, and circuit plates laminated on the insulating resin plate and including one circuit plate having a circuit pattern and an adhering pattern, which are selectively formed on the insulating resin plate;
a semiconductor element fixed to the circuit pattern of the insulating substrate with a bonding material;
a wiring member having an end connected to the one circuit plate of the insulating substrate;
a housing accommodating the insulating substrate, the semiconductor element, and the wiring member; and
a sealing material sealing the insulating substrate, the semiconductor element, and the wiring member accommodated in the housing, wherein the adhering pattern is an opening, in a plan view, disposed in the one circuit plate, and arranged between the semiconductor element fixed to the one circuit plate and the end of the wiring member fixed to the one circuit plate, the sealing material bonds the insulating resin plate through the opening to increase a bond between the sealing material and the insulating resin plate, and one of the circuit plates having the adhering pattern is bonded to the insulating resin plate by the sealing material through the opening as the adhering pattern.

2. The semiconductor device according to claim 1, wherein the adhering pattern is disposed closer to the semiconductor element fixed to the one circuit plate than the end of the wiring member fixed to the one circuit plate.

3. The semiconductor device according to claim 1, wherein the adhering pattern is provided along an end part of the semiconductor element or a fillet of the bonding material.

4. The semiconductor device according to claim 1, wherein the adhering pattern is located away from an end part of the semiconductor element at least 1.0 mm or at least ten times of a thickness of the bonding material.

5. The semiconductor device according to claim 1, wherein the insulating resin plate and the sealing material are formed from a same material.

6. The semiconductor device according to claim 1, wherein the sealing material includes a thermosetting resin.

7. A semiconductor device comprising:
   an insulating substrate including a metal plate, an insulating resin plate laminated on the metal plate, a first circuit plate and a second circuit plate, both circuit plates being laminated on the insulating resin, the first circuit plate including a circuit pattern and an adhering pattern, which are selectively formed on the insulating resin plate;
   a first semiconductor element having two electrodes which are opposed to each other, one electrode of the first semiconductor element being fixed to the first circuit plate with a bonding material;
   a second semiconductor element having two electrodes which are opposed to each other, one electrode of the second semiconductor element being fixed to the second circuit plate with a bonding material;
   a wiring member having two ends, one end being connected to the other electrode of the second semiconductor element;
   a housing accommodating the insulating substrate, the first semiconductor element, the second semiconductor element, and the wiring member; and
   a sealing material sealing the insulating substrate, the first semiconductor element, the second semiconductor element, and wiring member accommodated in the housing, wherein the adhering pattern is an opening or a recess, in a plan view, disposed in the first circuit plate, and is arranged between the first semiconductor element and the other end of the wiring member fixed to the first circuit plate, the sealing material bonds the insulating resin plate through the opening or recess to increase a bond between the sealing material and the insulating resin plate, and one of the circuit plates having the adhering pattern is bonded to the insulating resin plate by the sealing material through the opening or recess as the adhering pattern.

8. The semiconductor device according to claim 7, wherein the second circuit plate includes another adhering pattern having a recess, the recess being disposed around a periphery of the second circuit pattern and facing inside the second circuit pattern.

9. The semiconductor device according to claim 7, wherein the adhering pattern is formed at the first circuit plate where the circuit pattern is not formed.

10. A semiconductor device comprising:
    an insulating substrate including a metal plate, an insulating resin plate laminated on the metal plate, and circuit plates laminated on the insulating resin plate and including one circuit plate having a circuit pattern and an adhering pattern, which are selectively formed on the insulating resin plate;
    a semiconductor element fixed to the circuit pattern of the insulating substrate with a bonding material;
    a wiring member having an end connected to the one circuit plate of the insulating substrate;
    a housing accommodating the insulating substrate, the semiconductor element, and the wiring member; and
    a sealing material sealing the insulating substrate, the semiconductor element, and the wiring member accommodated in the housing,
    wherein the adhering pattern is a recess, in a plan view, disposed in the one circuit plate around a periphery of the one circuit plate and extending inwardly from the periphery of the one circuit plate including an upper surface thereof,
    the sealing material bonds the insulating resin plate through the recess to increase a bond between the sealing material and the insulating resin plate, and
    one of the circuit plates having the adhering pattern is bonded to the insulating resin plate by the sealing material through the recess as the adhering pattern.

11. The semiconductor device according to claim 10, wherein the recess is a part of the periphery of the circuit plate extending from a straight line or a corner of the periphery of the one circuit plate toward the inside of the one circuit plate in a plan view of the insulating substrate.

12. The semiconductor device according to claim 10, wherein a shape of the recess is constant from an upper surface of the one circuit plate to a lower surface of the one circuit plate laminated to the insulating resin plate.

* * * * *